(12) United States Patent
Roy

(10) Patent No.: US 6,788,123 B2
(45) Date of Patent: Sep. 7, 2004

(54) UNITY GAIN INTERPOLATOR FOR DELAY LOCKED LOOPS

(75) Inventor: Aninda K. Roy, San Jose, CA (US)

(73) Assignee: n Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/338,224

(22) Filed: Jan. 8, 2003

(65) Prior Publication Data

US 2004/0130371 A1 Jul. 8, 2004

(51) Int. Cl.[7] ................................................. H03K 3/12
(52) U.S. Cl. ........................ 327/261; 327/561; 330/130
(58) Field of Search ................................ 327/261, 264, 327/266, 269, 270, 271, 272, 274, 276, 278, 280, 284, 287, 288, 561, 562; 330/129, 130, 133, 136

(56) References Cited

U.S. PATENT DOCUMENTS

| | | | | |
|---|---|---|---|---|
| 5,170,134 A | * | 12/1992 | Bien | ............................ 330/255 |
| 5,233,314 A | * | 8/1993 | McDermott et al. | ........... 331/17 |
| 5,463,337 A | * | 10/1995 | Leonowich | .................. 327/158 |
| 5,521,499 A | * | 5/1996 | Goldenberg et al. | ......... 327/237 |
| 5,847,621 A | * | 12/1998 | Gutierrez | ................. 331/117 R |
| 5,892,376 A | * | 4/1999 | Tabatabai et al. | .............. 327/73 |
| 5,939,909 A | * | 8/1999 | Callahan, Jr. | ................ 327/108 |
| 6,104,223 A | * | 8/2000 | Chapman et al. | ............ 327/276 |
| 6,154,073 A | * | 11/2000 | Choi | ............................ 327/161 |
| 6,509,771 B1 | * | 1/2003 | Atallah et al. | ............... 327/175 |

* cited by examiner

Primary Examiner—Timothy P. Callahan
Assistant Examiner—An T. Luu
(74) Attorney, Agent, or Firm—Osha & May L.L.P.

(57) ABSTRACT

A method and apparatus for delaying a clock signal involves a first clock path arranged to propagate a first clock signal; a second clock path arranged to propagate a second clock signal; and an interpolator arranged as a unity gain operational amplifier. An amount of delay between the first and second clock signals is determined by a control voltage potential.

20 Claims, 6 Drawing Sheets

UNITY GAIN INTERPOLATOR FOR DELAY LOCKED LOOPS

BACKGROUND OF THE INVENTION

As the frequencies of modern computers continue to increase, the need to rapidly transmit data between chip interfaces also increases. To accurately receive data, source synchronous transmission may be used in which a clock signal is transmitted to help recover the data. The clock signal determines when a data signal should be sampled by a receiver's circuits.

The clock signal may transition at the beginning of the time the data signal is valid. The receiver often requires, however, that the clock signal transition during the middle of the time that the data signal is valid. Also, the transmission of the clock signal may degrade as it travels from its transmission source. In both circumstances, a delay locked loop, or DLL, can regenerate a copy of the clock signal at a fixed phase offset from the original clock signal.

FIG. 1 shows a typical source synchronous communication system (100). Data signals that are K bits wide are transmitted from circuit A (12) to circuit B (34) on a data path (14). To aid in the recovery of the transmitted data signals, a clock signal is transmitted on a clock path (16) at a similar time as the data signal. Although not shown, the communication system (100) could also have a path to transmit data signals from circuit B (34) to circuit A (12) along with an additional clock signal (not shown).

In FIG. 1, a DLL (40) generates a copy of the clock signal from the clock path (16) with a valid state and with a phase offset to be used by other circuits. For example, the DLL (40) outputs the copy of the clock signal with a predetermined phase offset to cause a latch device to sample the data signal. A latch device may be, for example, a flip-flop (38) as shown in FIG. 1. When the copy of the clock signal transitions, the flip-flop (38) samples the output of an amplifier (36) that amplifies the data signal on the data path (14). The latched signal from the flip-flop (38) is provided to other circuits on circuit B (34) as a local data signal (42).

The DLL (40) is arranged to maintain a constant phase offset between the clock signal input to the DLL (40) and the clock signal output from the DLL (40). The DLL (40) uses a delay stage to delay the clock signal input to the DLL (40). The DLL (40) may be required to provide relatively fine resolution adjustments to an amount of delay produced.

FIG. 2 shows a typical delay stage (200). The delay stage (200) may include a delay chain (250) and an interpolator (208). The delay chain (250) may include a plurality of delay elements (202, 204, 206). Each delay element (202, 204, 206) delays an input clock signal at an output of the delay element (202, 204, 206) by an amount of delay. For example, an input clock signal on signal path (201) is input to the delay element (202). A clock signal from the delay element (202) is output on a signal path (203). The clock signal on the signal path (203) is input to delay element (204). A clock signal from the delay element (204) is output on a signal path (205). Additional delay elements and signal paths, for example delay element (206) and signal path (207), may be added to the delay chain (250). The delay of each delay element (202, 204, 206) and the number of signal paths (201, 203, 205, 207) may determine the amount of delay of the delay chain (250).

In FIG. 2, the delay chain (250) can produce several amounts of delay. By designing a chain of delay elements (202, 204, 206), delays can be produced with different delay amounts on signal paths (201, 203, 205, 207) connected between the delay elements (202, 204, 206). For example, the delay amount on the signal path (205) is the result of a delay amount of delay element (204) in addition to the amount of delay on signal path (203).

In FIG. 2, a clock interpolator (208) receives the clock signals on the signal paths (201, 203, 205, 207). The clock interpolator (208) is used to improve the granularity of the delay amounts. The clock interpolator (208) may select two successive clock signals on the signal paths (201, 203, 205, 207) and produce a clock signal output (209) with a temporal delay in between the two successive clock signals from the signal paths (201, 203, 205, 207). The output clock signal on output clock path (209) may be used by other circuits, for example, a latch device.

The clock interpolator (208) receives control signals on control signal paths (211) that are M bits wide. The control signals may carry digital and/or analog signals. The control signals indicate the desired amount of delay between the input clock signal and output clock signal. Depending on the desired delay, the interpolator (208) may output on output clock path (209) one of the clock signals from the signal paths (201, 203, 205, 207) or an interpolated signal having a temporal delay in between two of the clock signals from the signal paths (201, 203, 205, 207).

FIG. 3 shows a schematic diagram of a typical interpolator (300). The interpolator (300) uses a pair of differential amplifiers (350, 360) to generate complementary output clock signals $\phi_3$ (311) and $\phi_{3\_}$ (313) with a temporal delay in between two input clock signals. Complementary input clock signals $\phi_1$ (303) and $\phi_{1\_}$ (305) are input to the first differential amplifier (350). Clock signal $\phi_1$ (303) connects to an n-channel transistor (306) and clock signal $\phi_{1\_}$ (305) connects to an n-channel transistor (308). Complementary input clock signals $\phi_2$ (307) and $\phi_{2\_}$ (309) are input to the second differential amplifier (360). Clock signal $\phi_2$ (307) connects to an n-channel transistor (310) and clock signal $\phi_{2\_}$ (309) connects to an n-channel transistor (312).

In FIG. 3, during a clock signal transition of complementary input clock signals $\phi_1$ (303) and $\phi_{1\_}$ (305), one of the n-channel transistors (306, 308) will conduct more current than the other. The one of the n-channel transistors (306, 308) that conducts more current will pull its respective complementary output clock signals $\phi_{3\_}$ (313) and $\phi_3$ (311) toward ground. The other one of the complementary output clock signals $\phi_{3\_}$ (313) and $\phi_3$ (311) will tend toward $V_{DD}$. The amount of current conducted through one of the n-channel transistors (306, 308) is determined by fixed value resistors (302, 304) and a value of a current source (314). The current source (314) is controlled by a control voltage potential $V_{CNTL}$ (315).

During a clock signal transition of complementary input clock signals $\phi_2$ (307) and $\phi_{2\_}$ (312), one of the n-channel transistors (310, 312) will conduct more current than the other. The transition of complementary input clock signals $\phi_2$ (307) and $\phi_{2\_}$ (312) are temporally delayed after the transition of complementary input clock signals $\phi_1$ (303) and $\phi_{1\_}$ (305). The one of the n-channel transistors (310, 312) that conducts more current will pull its respective complementary output clock signals $\phi_{3\_}$ (313) and $\phi_3$ (311) toward ground. The other one of the complementary output clock signals $\phi_{3\_}$ (313) and $\phi_3$ (311) will tend toward $V_{DD}$. The amount of current conducted through one of the n-channel transistors (310, 312) is determined by the fixed value resistors (302, 304) and a value of a current source (316). The current source (316) is controlled by the control voltage potential $V_{CNTL}$ (315).

By controlling the control voltage potential $V_{CNTL}$ (315), the mixing weight between the complementary input clock signals $\phi_1$ (303) and $\phi_{1\_}$ (305) and complementary input clock signals $\phi_2$ (307) and $\phi_{2\_}$ (312) may be adjusted. The slew rate of the complementary output clock signals $\phi_3$ (311) and $\phi_{3\_}$ (313) is modified to change the temporal delay of the complementary output clock signals $\phi_3$ (311) and $\phi_{3\_}$ (313) in between the complementary input clock signals $\phi_1$ (303) and $\phi_{1\_}$ (305) and complementary input clock signals $\phi_2$ (307) and $\phi_{2\_}$ (312). Using a change in slew rate to achieve a temporal delay increases distortion and variability of the interpolator (300) output.

SUMMARY OF THE INVENTION

According to one aspect of the present invention, a clock signal delay apparatus comprises a first clock path arranged to propagate a first clock signal; a second clock path arranged to propagate a second clock signal; and a first interpolator arranged to delay the second clock signal responsive to the first clock signal where an amount of delay between the first clock signal and the second clock signal is determined by a first control voltage potential, and where the first interpolator is arranged as a unity gain operational amplifier.

According to one aspect of the present invention, a method for delaying a clock signal, comprises transmitting a first clock signal; transmitting a second clock signal; and delaying the second clock signal responsive to the first clock signal using a first interpolator arranged as a unity gain operational amplifier where an amount of delay between the first clock signal and the second clock signal is determined by a first control voltage potential.

Other aspects and advantages of the invention will be apparent from the following description and the appended claims.

DETAILED DESCRIPTION

Embodiments of the present invention relate to an apparatus and method delaying a clock signal using an interpolator. In one or more embodiments, the interpolator is responsive to a control signal to adjust an amount of delay. The interpolator may be arranged as a unity gain operational amplifier and may be used as part of a delay locked loop delay stage.

Figure 1:
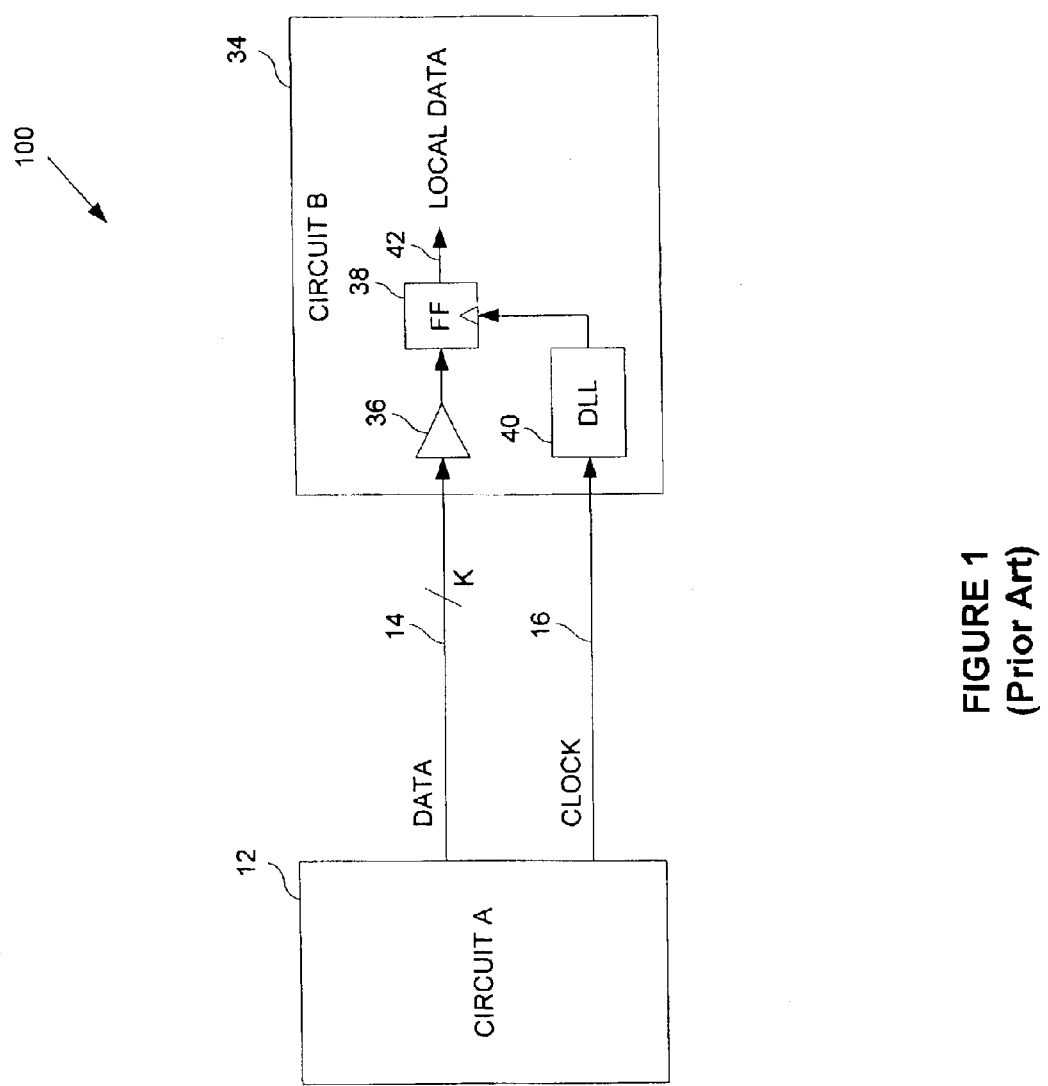
FIG. 1 shows a block diagram of a typical source synchronous communication system.
Figure 2:
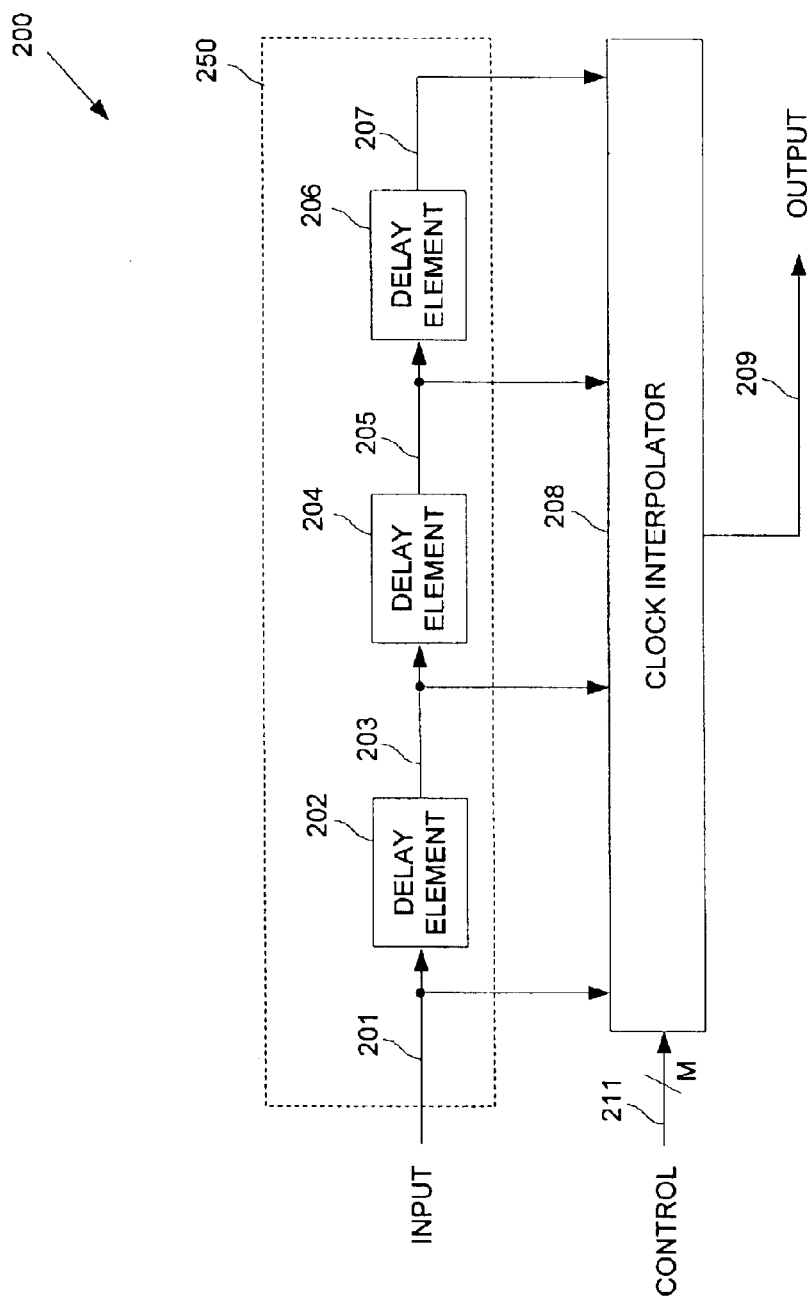
FIG. 2 shows a block diagram of a typical delay stage.
Figure 3:
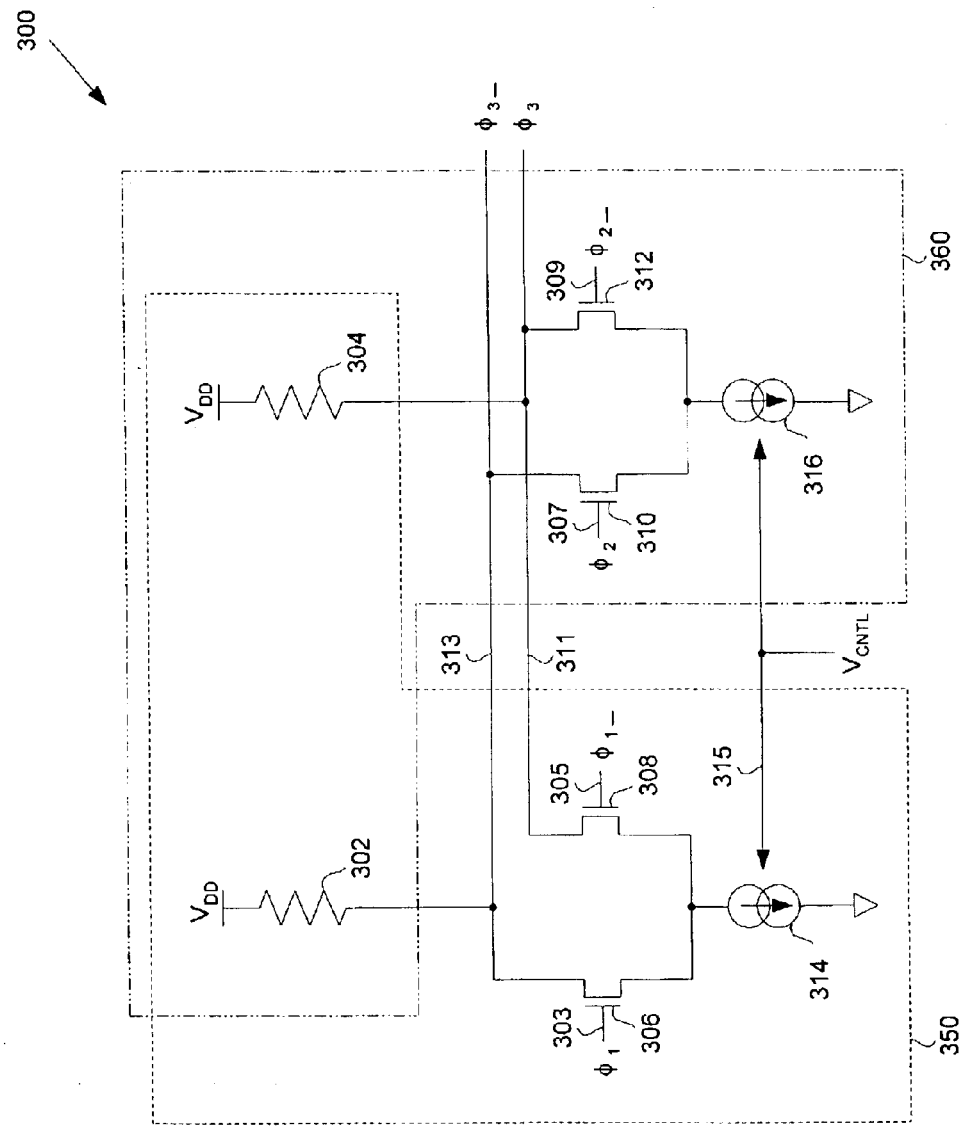
FIG. 3 shows a schematic diagram of a typical interpolator.
Figure 4:
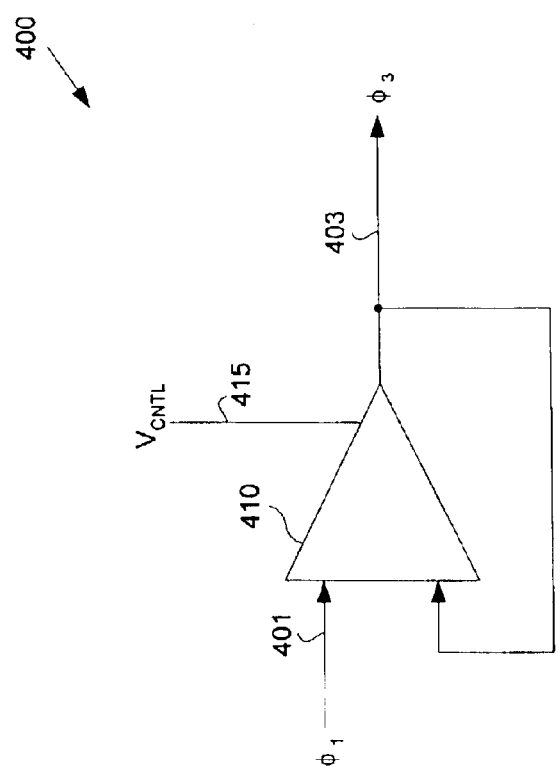
FIG. 4 shows a block diagram of a clock signal delay apparatus in accordance with an embodiment of the present invention.

In FIG. 4, a block diagram of an exemplary clock signal delay apparatus (400) in accordance with an embodiment of the present invention is shown. An interpolator (410) delays an output clock signal on output clock path (403) relative to an input clock signal on input clock path (401). The interpolator (410) is arranged as a unity gain operational amplifier. Accordingly, the output clock signal on output clock path (403) is used in a feedback loop to one of the inputs of the interpolator (410). The interpolator (410) has an additional control voltage potential $V_{CNTL}$ (415) to adjust the delay between the input clock signal on input clock path (401) and the output clock signal on output clock path (403).

In FIG. 4, the interpolator (410) arranged as a unity gain operational amplifier produces a slew rate for the output clock signal on output clock path (403) similar to that of the slew rate for the input clock signal on input clock path (401). The control voltage potential $V_{CNTL}$ (415) adjusts the delay of the output clock signal on output clock path (403). The interpolator (410) is able to maintain a similar output clock signal on output clock path (403) and input clock signal on input clock path (401) slew rate due to a high open loop gain. The unity gain arrangement of the interpolator (410) with a high open loop gain allows the interpolator (410) to easily track the slew rate of the input clock signal on input clock path (401).

Figure 5:
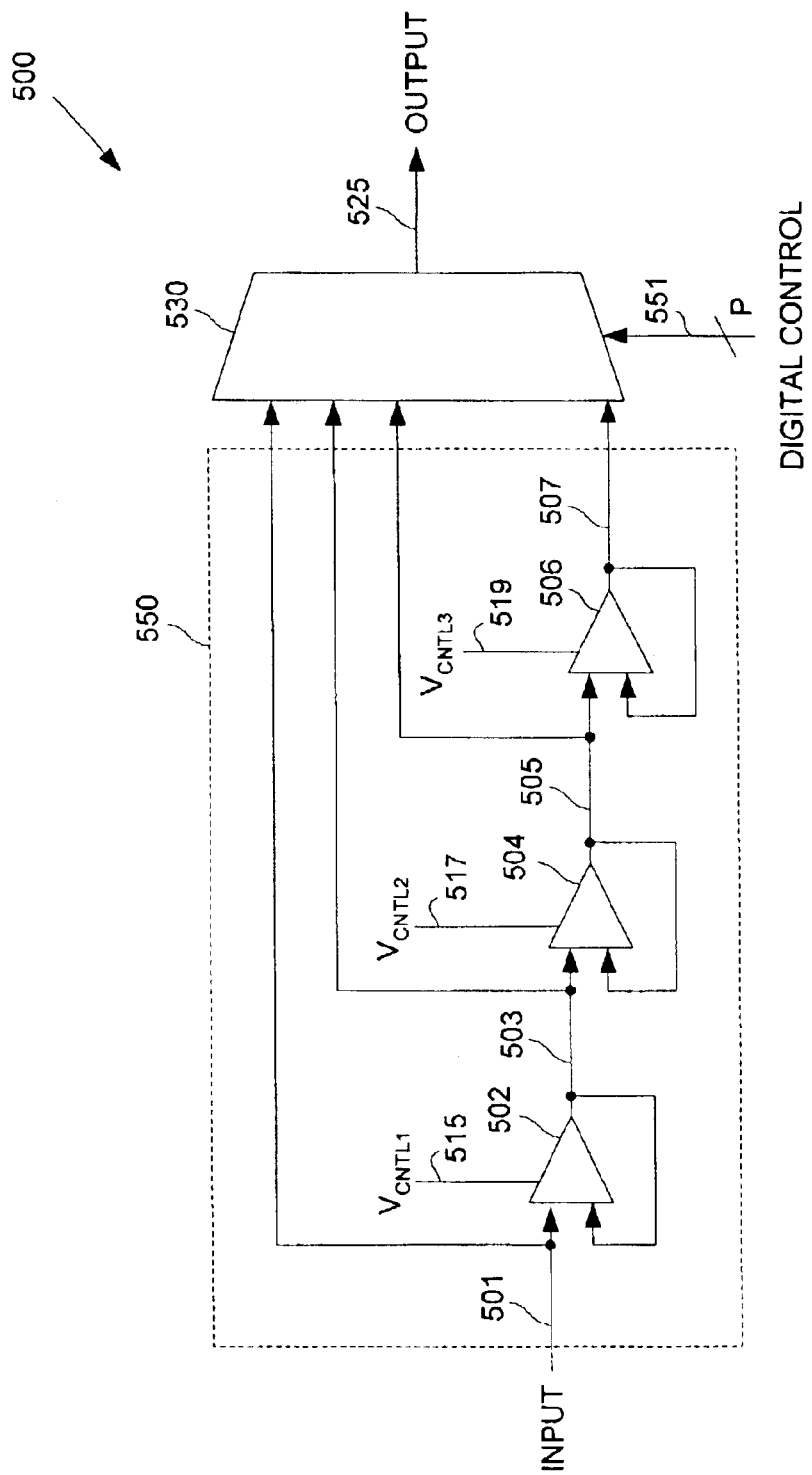
FIG. 5 shows a block diagram of a delay stage in accordance with an embodiment of the present invention.

In FIG. 5, a block diagram of an exemplary delay stage (500) in accordance with an embodiment of the present invention is shown. The delay stage (500) includes a delay chain (550) and a multiplexer (530). The delay chain (550) may include a plurality of delay elements (502, 504, 506). For example, each delay element (502, 504, 506) may be a clock signal delay apparatus (400) as shown in FIG. 4.

The delay elements (502, 504, 506) delay an input clock signal at an output of the delay element (502, 504, 506) by an amount of delay. For example, an input clock signal on signal path (501) is input to the delay element (502). A clock signal from the delay element (502) is output on a signal path (503). The clock signal on the signal path (503) is input to delay element (504). A clock signal from the delay element (504) is output on a signal path (505). Additional delay elements and signal paths, for example delay element (506) and signal path (507), may be added to the delay chain (550). The delay of each delay element (502, 504, 506) and the number of signal paths (501, 503, 505, 507) may determine the amount of delay of the delay chain (550).

In FIG. 5, the delay chain (550) can produce several amounts of delay. By designing a chain of delay elements (502, 504, 506), delays can be produced with different delay amounts on signal paths (501, 503, 505, 507) connected between the delay elements (502, 504, 506). For example, the delay amount on the signal path (505) is the result of a delay amount of delay element (504) in addition to the amount of delay on signal path (503).

In FIG. 5, a multiplexer (530) receives the clock signals on the signal paths (501, 503, 505, 507). The multiplexer (530) receives control signals on control signal paths (551) that are P bits wide. The multiplexer (530) selects one of the clock signals on the signal paths (501, 503, 505, 507) based on the control signals on control signal paths (551) to produce an output clock signal on output clock path (525). The output clock signal on output clock path (209) may be used by other circuits, for example, a latch device.

The delay elements (502, 504, 506) are each responsive to a control voltage potential, $V_{CNTL1}$ (515), $V_{CNTL2}$ (517), $V_{CNTL3}$ (519), respectively. The control voltage potentials (515, 517, 519) control the amount of delay of each delay element (502, 504, 506). Each delay element (502, 504, 506) has a range of delays that the delay element (502, 504, 506) may add to the delay chain (550). By adjusting the control voltage potentials (515, 517, 519), the delay chain (550) may carry the desired amount of delay on one of the signal paths (501, 503, 505, 507). The multiplexer (530) produces the desired amount of delay by selecting the clock signal from an appropriate one of the signal paths (501, 503, 505, 507) to be output on the output clock path (525). The output clock signal on output clock path (525) may have a fine scale resolution for the temporal delay of the delay stage (500).

According to an, embodiment of the present invention, the delay stage (500) uses a plurality of interpolators arranged as unity gain operational amplifiers for the delay elements (502, 504, 506). Each interpolator has a control voltage potential (515, 517, 519) to adjust the delay through the interpolator. Accordingly, the interpolator provides a slew rate at an output clock signal similar to a slew rate of in input clock signal. By using a plurality of interpolators in delay chain (550) and the multiplexer (530), a wider range of delay amounts may be produced compared to a single interpolator.

One of ordinary skill in the art will understand that the control voltage potentials (515, 517, 519) may be independently controlled or controlled with a single control voltage potential.

Figure 6:
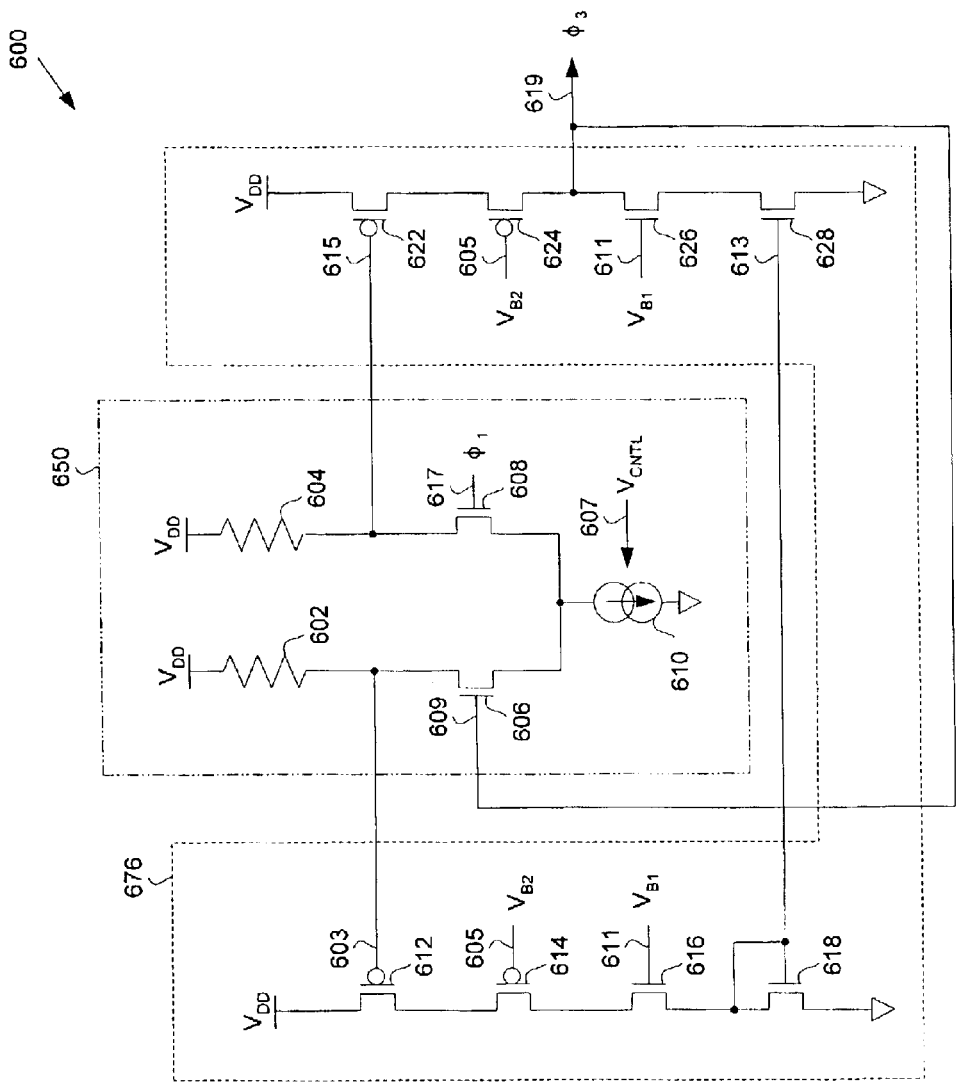
FIG. 6 shows a schematic diagram of a two stage cascode amplifier in accordance with an embodiment of the present invention.

FIG. 6 shows a schematic diagram of an exemplary two stage cascode amplifier (600) in accordance with an embodiment of the present invention. The two stage cascode amplifier (600) has a differential amplifier (650) and a cascode amplifier (676).

In FIG. 6, the differential amplifier (650) includes n-channel transistors (606, 608), fixed value resistors (602, 604), and a current source (610) controlled by a control voltage potential $V_{CNTL}$ (607). The input clock signal $\phi_1$ on input clock path (617) is received on one side of the differential amplifier (650). The other terminal of the differential amplifier (650) receives an output clock signal $\phi_3$ from an output clock path (619). The output clock signal $\phi_3$ is used in a feedback loop to n-channel transistor (606) as an input to the differential amplifier (650).

In FIG. 6, the cascode amplifier (676) includes two transistor stacks. One of the transistor stacks includes p-channel transistors (612, 614) and n-channel transistors (616, 618). The other transistor stack includes p-channel transistors (622, 624) and n-channel transistors (626, 628). The n-channel transistors (616, 626) receive a fixed bias voltage potential $V_{B1}$ (611), and the p-channel transistors 614, 624) receive a fixed bias voltage potential $V_{B2}$ (605).

In FIG. 6, as input clock signal $\phi_1$ transitions, a signal on signal path 615) changes. The cascode amplifier (676) amplifies the change in the differential amplifier (650). Accordingly, output clock signal $\phi_3$ tracks input clock signal $\phi_1$ plus some additional delay determined by the fixed value resistors (602, (604) and a value of the current source (610). The current source (610) is adjusted by the control voltage potential $V_{CNTL}$ (607). The output clock signal $\phi_3$ affects the n-channel transistor (606) on the other side of the differential amplifier (650). Accordingly, the differential amplifier (650) changes a signal on signal path (603) and the amount of current conducted by n-channel transistor (608). The changes to the signal on signal path (603) eventually affect the signal on signal path (613) through the diode connected n-channel transistor (618). Also, the signal on signal path (615) is affected by the change in current conducted by n-channel transistor (608).

The two stage cascode amplifier (600) shown in FIG. 6 provides an exemplary embodiment of an interpolator arranged as a unity gain operational amplifier, such as the clock signal delay apparatus (400) shown in FIG. 4. The open loop gain of the two stage cascode amplifier (600) is relatively high. Accordingly, the slew rate between the input clock signal $\phi_1$ and the output clock signal $\phi_3$ is similar. An amount of delay between the input clock signal $\phi_1$ and the output clock signal $\phi_3$ is adjustable by using control voltage potential $V_{CNTL}$ (607).

Advantages of the present invention may include one or more of the following. In one or more embodiments, because a high open loop gain interpolator is used, a slew rate between an input clock signal and an output clock signal is similar.

In one or more embodiments, because a control voltage potential serves as an input to an interpolator arranged as a unity gain operational amplifier, an amount of delay between an input clock signal and an output clock signal is adjustable.

In one or more embodiments, a plurality of interpolators arranged as unity gain operational amplifiers may be combined in a delay chain to provide a wider range of possible amounts of delay. A multiplexer may be used to select one of the signals from the delay chain as an output signal. Advantageously, the control voltage potentials of the interpolators in the delay chain may be independently controlled or controlled with a single control voltage potential.

In one or more embodiments, because an interpolator arranged as a unity gain operational amplifier is used, distortion and variability of an output clock signal is reduced.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A clock signal delay apparatus, comprising:
    a first clock path arranged to propagate a first clock signal;
    a second clock path arranged to propagate a second clock signal, the second clock signal being a delayed version of the first clock signal; and
    a first interpolator arranged to output the second clock signal responsive to the first clock signal, wherein an amount of delay between the first clock signal and the second clock signal is determined by a first control voltage potential, and wherein the first interpolator is arranged as a unity gain operational amplifier.

2. The clock signal delay apparatus of claim 1, wherein the first interpolator comprises a two stage cascode amplifier.

3. The clock signal delay apparatus of claim 2, wherein the two stage cascode amplifier comprises a differential amplifier and a cascode amplifier.

4. The clock signal delay apparatus of claim 1, wherein the first interpolator is operatively connected to a multiplexer.

5. The clock signal delay apparatus of claim 1, further comprising:
    a third clock path arranged to propagate a third clock signal, the third clock signal being a delayed version of the second clock signal; and
    a second interpolator arranged to generate the third clock signal responsive to the second clock signal, wherein an amount of delay between the second clock signal and the third clock signal is determined by a second control voltage potential, and wherein the second interpolator is arranged as a unity gain operational amplifier.

6. The clock signal delay apparatus of claim 5, wherein the second interpolator is a two stage cascode amplifier.

7. The clock signal delay apparatus of claim 6, wherein the two stage cascode amplifier comprises a differential amplifier and a cascode amplifier.

8. The clock signal delay apparatus of claim 5, wherein the second interpolator is operatively connected to a multiplexer.

9. The clock signal delay apparatus of claim 5, further comprising:

a multiplexer arranged to select between the second clock signal and the third clock signal.

10. The clock signal delay apparatus of claim 5, wherein the first control voltage potential and the second control voltage potential are substantially equal.

11. A method for delaying a clock signal, comprising:

transmitting a first clock signal;

transmitting a second clock signal, the second clock signal being a delayed version of the first clock signal; and outputting the second clock signal responsive to the first clock signal using a first interpolator arranged as a unity gain operational amplifier, wherein an amount of delay between the first clock signal and the second clock signal is determined by a first control voltage potential.

12. The method of claim 11, wherein the first interpolator is a two stage cascode amplifier.

13. The method of claim 12, wherein the two stage cascode amplifier comprises a differential amplifier and a cascode amplifier.

14. The method of claim 11, wherein the first interpolator is operatively connected to a multiplexer.

15. The method of claim 11, further comprising:

transmitting a third clock signal, the third clock signal being a delayed version of the second clock signal; and generating the third clock signal responsive to the second clock signal using a second interpolator arranged as a unity gain operational amplifier, wherein an amount of delay between the second clock signal and the third clock signal is determined by a second control voltage potential.

16. The method of claim 15, wherein the second interpolator is a two stage cascode amplifier.

17. The method of claim 16, wherein the two stage cascode amplifier comprises a differential amplifier and a cascode amplifier.

18. The method of claim 15, wherein the first interpolator is operatively connected to a multiplexer.

19. The method of claim 15, further comprising:

inputting the second clock signal and the third clock signal into a multiplexer arranged to select between the second clock signal and the third clock signal.

20. The method of claim 15, wherein the first control voltage potential and the secondary control voltage potential are substantially equal.

* * * * *

UNITED STATES PATENT AND TRADEMARK OFFICE
CERTIFICATE OF CORRECTION

PATENT NO. : 6,788,123 B2
DATED : September 7, 2004
INVENTOR(S) : Aninda K. Roy

It is certified that error appears in the above-identified patent and that said Letters Patent is hereby corrected as shown below:

Title page,
Item [73], Assignee, should read -- Sun Microsystems, Inc., Santa Clara, CA (US) --.

Column 8,
Line 27, please replace "secondary" with -- second --.

Signed and Sealed this

Twenty-second Day of February, 2005

JON W. DUDAS
*Director of the United States Patent and Trademark Office*